United States Patent
Reinart (10) Patent No.: US 9,569,307 B2
(45) Date of Patent: Feb. 14, 2017

(54) MITIGATING THE IMPACT OF A SINGLE POINT OF FAILURE IN AN OBJECT STORE

(71) Applicant: Quantum Corporation, San Jose, CA (US)

(72) Inventor: John Reinart, Roseville, MN (US)

(73) Assignee: Quantum Corporation, San Jose, CA (US)

( * ) Notice: Subject to any disclaimer, the term of this patent is extended or adjusted under 35 U.S.C. 154(b) by 95 days.

(21) Appl. No.: 14/180,149

(22) Filed: Feb. 13, 2014

(65) Prior Publication Data
US 2015/0227423 A1    Aug. 13, 2015

(51) Int. Cl.
*G06F 11/10*    (2006.01)

(52) U.S. Cl.
CPC .................. *G06F 11/1076* (2013.01)

(58) Field of Classification Search
CPC .................. G06F 11/1076; H04L 1/0057
See application file for complete search history.

(56) References Cited

U.S. PATENT DOCUMENTS

| | | | |
|---|---|---|---|
| 7,277,950 B1* | 10/2007 | Chapweske | H04L 67/104 709/203 |
| 2007/0136525 A1* | 6/2007 | Read | 711/114 |
| 2009/0182890 A1* | 7/2009 | Moorer | 709/231 |
| 2013/0198582 A1* | 8/2013 | Stauffer et al. | 714/755 |
| 2013/0198583 A1* | 8/2013 | Shen et al. | 714/756 |
| 2014/0281784 A1* | 9/2014 | Verma et al. | 714/752 |

* cited by examiner

*Primary Examiner* — Albert Decady
*Assistant Examiner* — Kyle Vallecillo
(74) *Attorney, Agent, or Firm* — Eschweiler & Associates, LLC (57) ABSTRACT

Example apparatus and methods distribute ranges or erasure codes associated with ranges to reduce or minimize the impact of a single point of failure in an object store. Erasure codes associated with related ranges to be stored in an object store may be accessed and selectively distributed to different storage devices associated with the object store. The erasure codes may be distributed according to a distribution plan so that an unavailability of one storage device will cause less than all of the related ranges to become unavailable. Example apparatus and methods may also provide a partial GET operation that will retrieve erasure codes associated with less than an entire object or with less than all possible ranges for an object. The partial GET operation may facilitate reconstructing less than an entire object, which may be valuable in, for example, weblog analytics.

12 Claims, 10 Drawing Sheets

MITIGATING THE IMPACT OF A SINGLE POINT OF FAILURE IN AN OBJECT STORE

BACKGROUND

Object stores may store objects using rateless erasure codes (e.g., fountain codes). An object to be stored may be sub-divided into ranges, which may also be referred to as super blocks. Ranges or super blocks may be encoded independently and stored independently. Ranges may also be retrieved and decoded independently. Theoretically, retrieving, decoding, and even reconstructing one range for an object ought to be possible even if another range is damaged or otherwise unavailable. Unfortunately, this theoretical partial recovery may be difficult, if even possible at all, to achieve using conventional systems. One difficulty may arise when conventional systems pay insufficient attention to how different ranges or super blocks are stored.

An object store, which may also be referred to as an object based storage system, may have multiple devices (e.g., disks) in multiple apparatus (e.g., servers) positioned at multiple locations (e.g., sites). An object store may be controlled with respect to where any given erasure code is stored or with respect to where any given collection of erasure codes are stored. Conventional object stores may use pre-defined or static configuration settings to statically determine erasure code locations and distributions. The control may be exercised when an erasure code is stored. For example, conventional object storage systems may use static, pre-defined settings to distribute erasure codes across a collection of disks, servers, racks, sites or other devices when a store operation is performed. Unfortunately, by relying on static, pre-defined configuration values, these conventional systems may inadvertently, or even intentionally, position ranges in ways that increase the likelihood that a single point of failure can have dire consequences.

The shortcomings of conventional systems that do not intelligently distribute related ranges to different drives or sets of drives may be compounded by conventional GET operations that retrieve erasure codes from an object store. A conventional GET operation may only return a complete object or no object. Thus, if any range is unavailable, as may be likely with a conventional system, then the GET operation may return no object, even if some of the ranges are available and undamaged.

A conventional GET operation will only retrieve data from an entirely intact object. However, conventional systems may reduce the likelihood that an entirely intact object will be available. Thus, conventional systems may consume resources (e.g., CPU, memory) storing ranges for objects that may be difficult, if even possible at all, to retrieve using conventional GET operations.

An erasure code is a forward error correction (FEC) code for the binary erasure channel. The FEC facilitates transforming a message of k symbols into a longer message with n symbols such that the original message can be recovered from a subset of the n symbols, k and n being integers, n>k. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols suffice to recover the original message. Optimal codes may require extensive memory usage, CPU time, or other resources when n is large.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure code.

Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless erasure code is distinguished from an erasure code that exhibits a fixed code rate.

Object based storage systems may employ rateless erasure code technology (e.g., fountain codes) to provide a flexible level of data redundancy. The appropriate or even optimal level of data redundancy produced using a rateless erasure code system may depend, for example, on the number and type of devices available to the object based storage system. The actual level of redundancy achieved using a rateless erasure code system may depend, for example, on the difference between the number of readable redundancy blocks (e.g., erasure codes) written by the system and the number of redundancy blocks needed to reconstruct the original data. For example, if twenty redundancy blocks are written for an object and only eleven redundancy blocks are needed to reconstruct the object that was protected by generating and writing the redundancy blocks, then the object may be reconstructed even if nine of the redundancy blocks are damaged or otherwise unavailable. Objects may be sub-divided into ranges and then erasure codes may be generated for each of the ranges. When objects are divided into ranges and erasure codes are generated for each of the ranges, then the redundancy established in the object store may be achieved on a per range basis rather than on a per object basis.

Object based storage systems using rateless erasure code technology may facilitate storing erasure codes according to different redundancy policies (e.g., 7/3, 20/9, 20/2). A redundancy policy may be referred to as an NIM redundancy policy where N total erasure codes are generated and the message can be regenerated using any N-M of the N total erasure codes, M and N being integers, M<N.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

An object storage system, which may also be referred to as an object store, may use rateless erasure codes (e.g., fountain codes) to store objects. Example apparatus and methods facilitate retrieving intact portions of a damaged object, even when some portions of the object cannot be retrieved, decoded, or reconstructed. The portions may be unavailable due, for example, to drive failure. The object store may include multiple devices (e.g., disks) on which erasure codes can be stored. While conventional systems may use pre-defined configuration settings to statically determine distribution patterns, example apparatus and methods may store related ranges for an object on distinct sets of drives to reduce or even eliminate the negative impacts of a drive failure or other condition that makes a drive or range unavailable. For example, storing related ranges on distinct sets of drives may reduce or eliminate the chance that a drive failure will affect multiple ranges for an object. "Related ranges" refers, for example, to the ranges into which a single item (e.g., object, file) has been subdivided before further subdivision associated with erasure code generation. An individual range may be further subdivided by an erasure code generation process.

Object based storage systems using rateless erasure code technology may facilitate storing erasure codes across multiple devices to mitigate issues associated with a single point of failure. A single point of failure (SPOF) is a component in an overall object storage system that, if it fails, will cause loss of access to some amount of data. For example, if an entire set of data is on one hard disk drive (HDD) and that HDD fails, then that entire set of data is lost. A redundancy level and the distribution of check blocks (e.g., erasure codes) protect against these types of failures. Failures may be either temporary or permanent. Both are undesirable, but permanent failures are more serious. HDD failures are usually permanent, while other failures (e.g., storage node) are sometimes repairable or replaceable. Therefore, users are interested in protecting data from HDD failures.

Conventional object storage systems may use static "safety" settings and policies to protect from at least four categories of failures: HDD, storage node, rack, or site. Conventional object storage technology may attempt to evenly divide data across as many HDD, storage nodes, racks, and sites as possible. For example, if there are two or three sites available, then redundancy codes may be evenly spread between the sites. Similarly, if there are a number of racks, storage nodes, or HDD available, then redundancy codes may be evenly spread between the racks, storage nodes, and HDD. Unfortunately, evenly spreading ranges or redundancy codes may not produce optimal results.

Redundancy provides safety from failures but is costly because additional safety achieved by writing additional erasure codes costs more. Cost may be affected by the type of failure to be protected against. Site failures are the most costly to protect against. An 18/6 N/M policy protects against loss of a single site. Protecting against two site failures would require an 18/12 policy at double the cost. While some storage systems protect against loss of a single site, protection from loss of two sites is typically too expensive with object storage. Protection from loss of two sites might be viable using, for example, different storage technologies (e.g., offsite tape copies, RAID-6).

Different storage technologies have different characteristics. For example, tape and RAID-6 may have different costs (tape less expensive, RAID-6 more expensive due to enterprise grade HDD usage) and different propensities to failure. Object storage systems may use HDDs that are less expensive than enterprise grade HDDs and may offer selectable levels of failure protection (e.g. from very low to very high).

Example apparatus and methods may identify distribution plans based on factors including improving or optimizing fault tolerance, improving or optimizing partial read performance, or other factors. In one embodiment, the distribution plans may be identified from user defined rules. In another embodiment, the distribution plans may be identified from automated rules. Example apparatus and methods may provide or interact with a user interface that facilitates identifying a distribution plan.

Example apparatus and methods also provide a partial GET operation that may return less than a completely intact object. For example, the GET operation may return less than all the ranges for an object. In one embodiment, the GET operation may identify which ranges for an object are retrievable or were retrieved, and may identify which ranges are not able to be retrieved or were not retrieved.

Conventional systems may not have considered providing partial results due to the all or nothing mentality concerning data retrieval, which held that either enough erasure codes were available to reconstruct an entire object, or that the object could not be reconstructed. This thinking may have ignored use cases where even though all the data for an object may not be available, there may be value in retrieving a portion of an object. For example, in analytics, there may be a file that stores a large number of small, time-ordered transactions. Being able to retrieve less than all the transactions may still support generating useful statistics and performance analysis. By way of illustration, in weblog analytics, value can still be derived from just a portion of an object that provides just a portion of the data for the weblog.

When partial retrieval that yields less than a complete set of ranges is possible and provides data having at least a desired utility, then example apparatus and methods may be configured with lower safety settings (e.g., redundancy settings) than are commonly found in erasure code based object stores. For example, low safety use cases (e.g., 20/0, 20/1) may be employed. Consider weblog analytics where the most valuable data may be the newest data. Over time, the value of the data in a weblog may decline, which may reduce the amount of resources a user may want to allocate for redundant storage for data whose value is declining. Recall that even if a portion of a weblog is missing, the remaining data may be useful. Thus a lower-than-usual safety level coupled with a partial GET operation may be appropriate for some data to reduce storage costs while maintaining some value.

Figure 1:
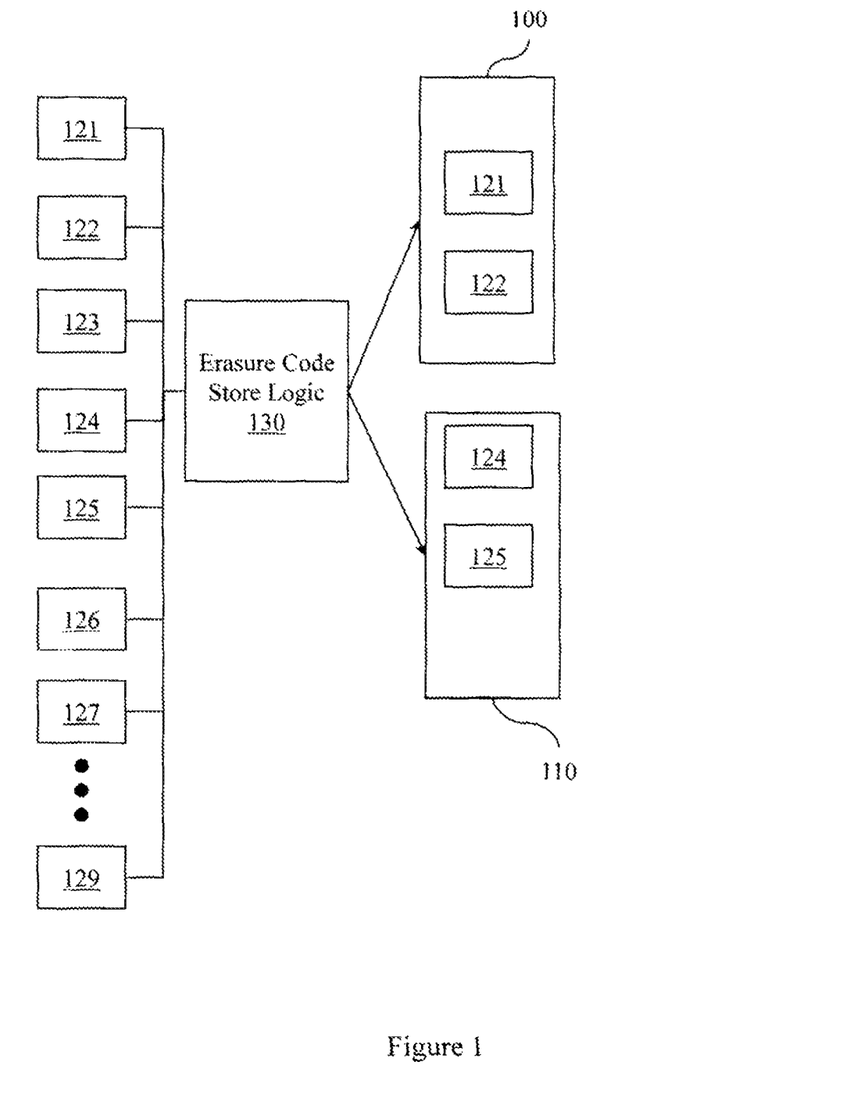
FIG. 1 illustrates an object store with multiple devices on which erasure codes can be stored.

FIG. 1 illustrates an object store that has devices 100 and 110 upon which erasure codes can be stored. Devices 100 and 110 may be, for example, disk drives (e.g., hard disk drives (HDD)). While two devices are illustrated, an object store may have more than two devices in which erasure codes can be stored. For example, an object storage system may have a plurality of disks located in a plurality of servers located in a plurality of racks located at a plurality of sites. An erasure code store logic 130 may be tasked with distributing erasure codes to the various locations available to the object store. The erasure code store logic 130 may be tasked with distributing erasure codes to device 100 and device 110 so that the impact of a single point of failure is reduced. At a higher level, erasure code store logic 130 may be tasked with distributing ranges to device 100 and device 110. How erasure code store logic 130 distributes the ranges or erasure codes associated with the ranges may be controlled, at least in part, by a distribution plan. The distribution plan may depend on user-defined rules, automated rules, default rules, or other information upon which decisions can be made. Conventionally, an erasure code store logic may have used static or pre-defined rules or information to control distribution.

FIG. 1 illustrates a set of erasure codes that includes erasure code 121 and erasure codes 122 through 129. The erasure codes may be distributed by erasure code store logic 130. FIG. 1 illustrates erasure code 121 and erasure code 122 stored on device 100 and erasure code 124 and 125 stored on device 110. Other members of the erasure codes may be stored on other devices that are not illustrated. The lowest safety factor that may be useable for storing erasure codes associated with a range may be determined, at least in part, by the number of devices (e.g., device 100, device 110) that are available to store the erasure codes. Similarly, the degree to which the impact of a single point of failure on range retrieval may be reduced may be determined, at least in part, by the number of devices (e.g., device 100, device 11) that are available to store the ranges.

Figure 2:
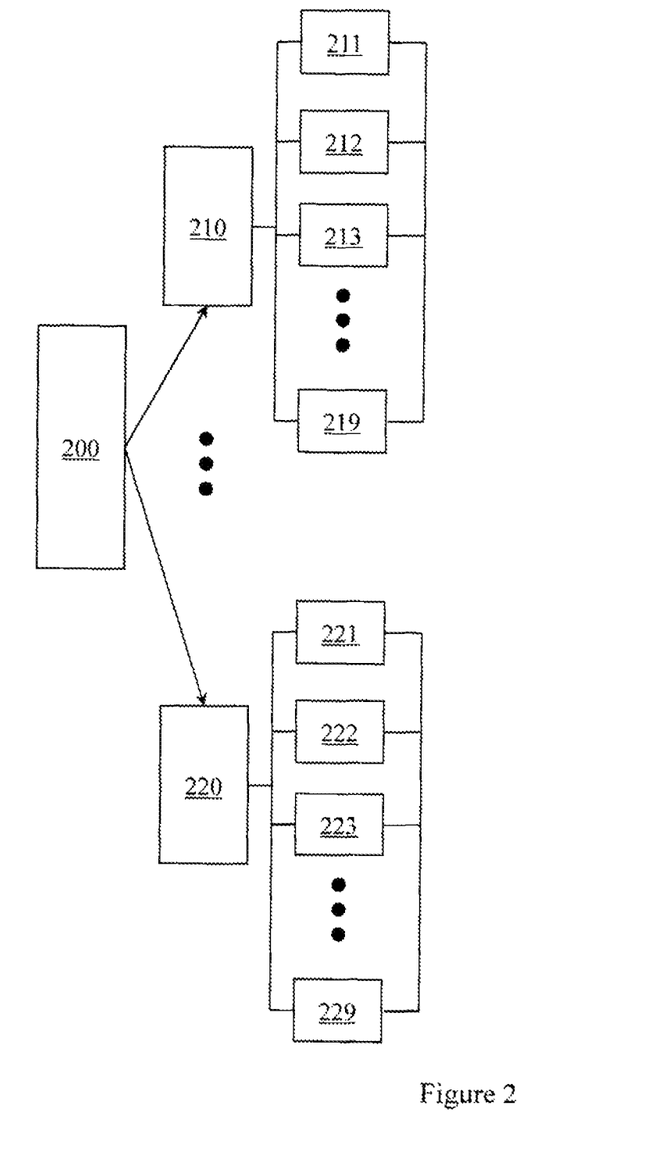
FIG. 2 illustrates an object that has been divided into multiple ranges, and erasure codes that have been generated for the ranges.

FIG. 2 illustrates an object 200 that has been divided into multiple ranges (e.g., range 210 through range 220). Erasure codes have been generated for each of the ranges. For example, erasure codes 211, 212 and 213 through 219 have been generated for range 210 and erasure codes 221, 222, and 223 through 229 have been generated for range 220. Recall that a range may be a segment or portion of a larger object. Erasure codes may be generated for each of the smaller segments or portions of a larger object. Conventionally, unless enough erasure codes could be retrieved to reconstruct the entire object, a GET operation may have reported a failure. Example apparatus and methods are not so limited. Instead, as long as a sufficient number of erasure codes can be retrieved to reconstruct a range, a GET operation may return a partial result. Intelligent distribution of erasure codes and ranges may increase the likelihood that a range can be successfully retrieved by reducing the impact of any single point of failure in an erasure code based object store.

Figure 3:
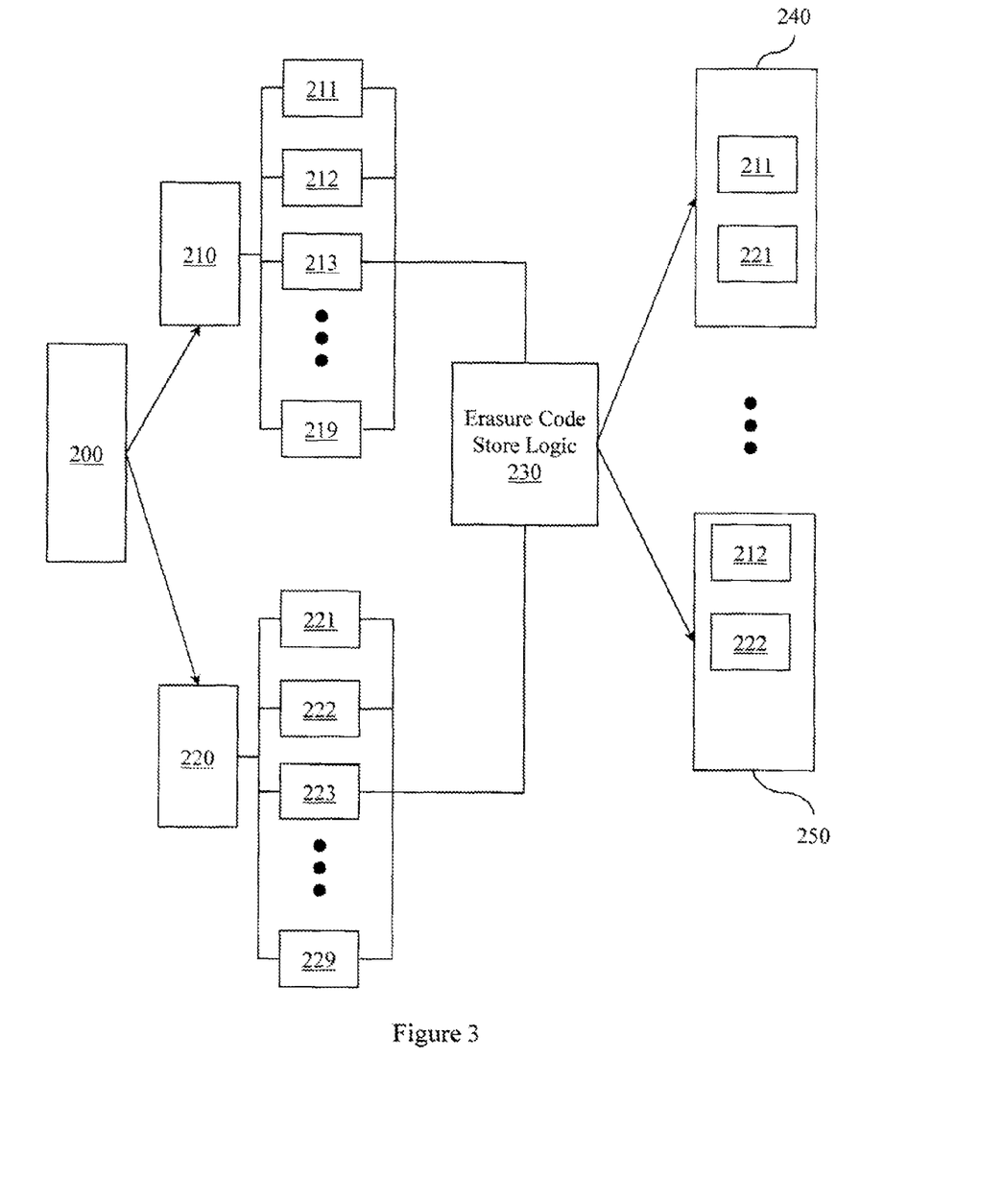
FIG. 3 illustrates distributing erasure codes for different ranges to different storage apparatus.

FIG. 3 illustrates an erasure code store logic 230 distributing erasure codes for different ranges to different storage apparatus. To mitigate the impact of a single point of failure in an object store, erasure code store logic 230 may distribute erasure codes associated with different ranges to different devices according to a plan. For example, erasure code 211, which is associated with range 210, is stored on device 240 while erasure code 212, which is also associated with range 210, is stored on device 250. Similarly, erasure code 221, which is associated with range 220, is stored on device 240 while erasure code 222, which also associated with range 220, is stored on device 250. Other erasure codes associated with the ranges may be stored on other devices. In one embodiment, the devices may be selected to allow the retrieval of the maximum number of ranges if a single device becomes unavailable (e.g., fails, crashes). In another embodiment, the devices may be selected so that at least one range will be retrievable if a single device becomes unavailable.

Figure 4:
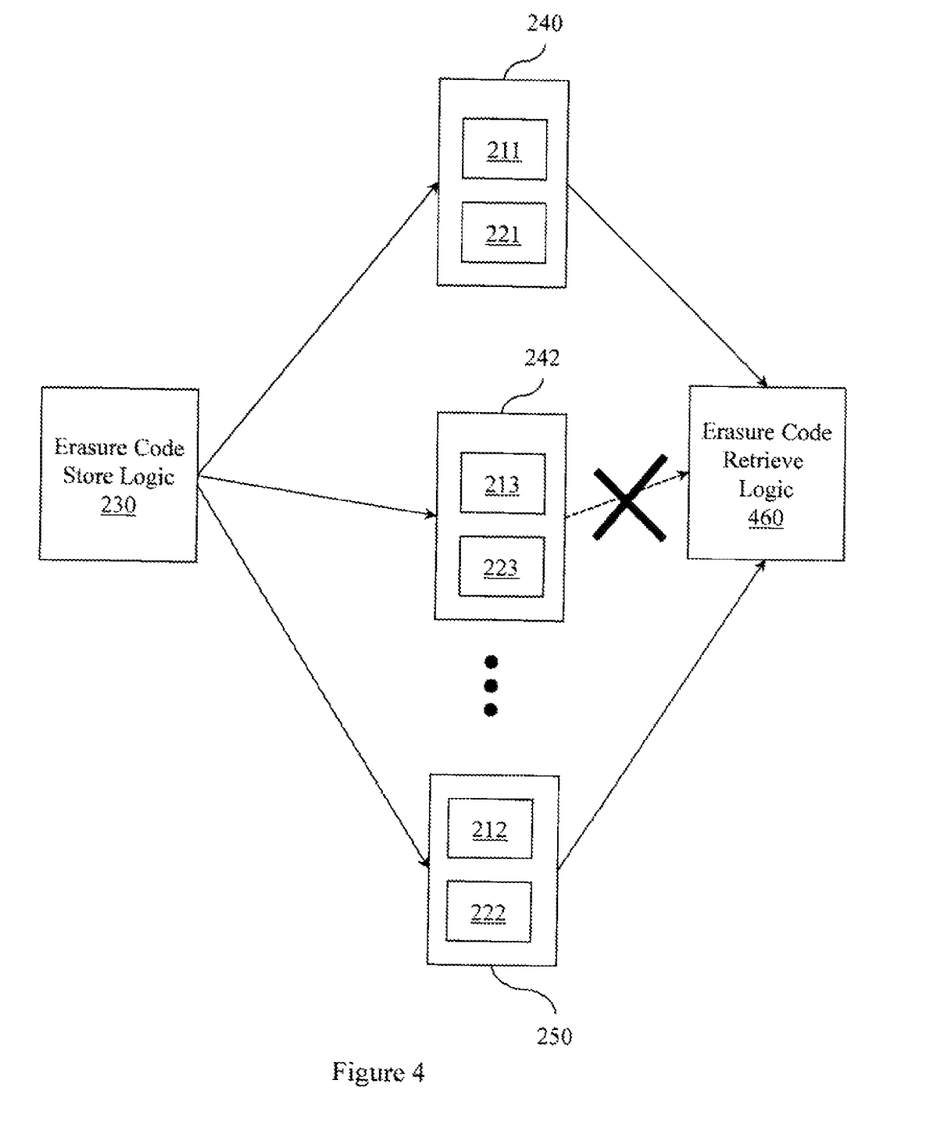
FIG. 4 illustrates a scenario where a storage apparatus is unavailable.

FIG. 4 illustrates a scenario where a storage apparatus is unavailable. An erasure code retrieve logic 460 may be tasked with reconstructing object 200. However, device 242 may be unavailable and thus some erasure codes associated with object 200 may be unavailable. When device 242 is unavailable, it may not be possible to reconstruct all the ranges for object 200. For example, to reconstruct the entire object 200, it may be necessary to acquire erasure codes 213 and 223 so that a certain range can be reconstructed. Rather than report failure like a conventional GET operation, example apparatus and methods may collect erasure codes for ranges that can be reconstructed and then reconstruct those ranges to complete a partial GET operation. In one embodiment, erasure code retrieve logic 460 may first provide information about whether the entire object 200 can be reconstructed, may provide information about which ranges, if any, can be reconstructed, and may provide information about which range(s) may not be able to be reconstructed. Example apparatus and methods may then selectively retrieve erasure codes and selectively reconstruct certain ranges.

Figure 5:
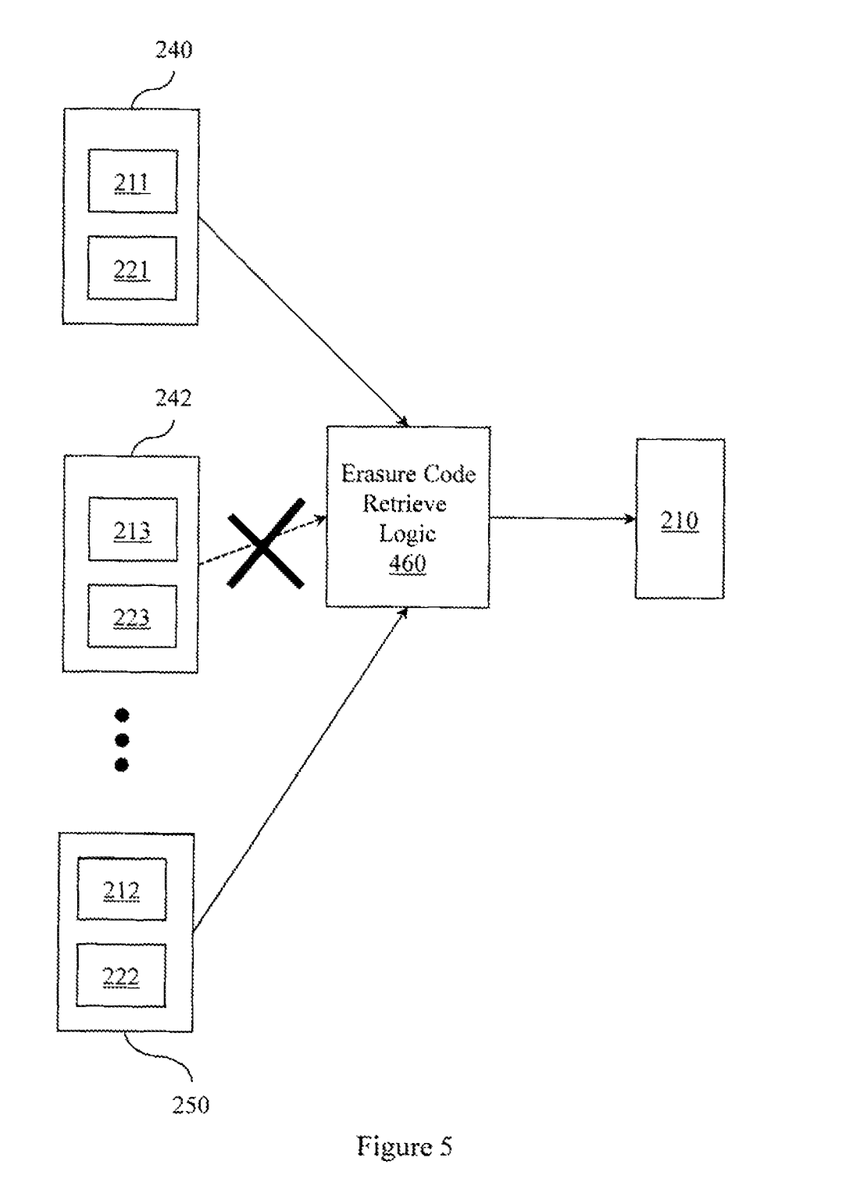
FIG. 5 illustrates acquiring, decoding, and reconstructing a portion of an object even though a storage apparatus is unavailable.

FIG. 5 illustrates erasure code retrieve logic 460 acquiring, decoding, and reconstructing a portion of an object even though storage apparatus 242 is unavailable and thus erasure codes 213 and 223 are unavailable. Even though apparatus 242 is unavailable, apparatus 240 and apparatus 250 are available. Erasure code retrieve logic 460 may, therefore, be able to acquire erasure codes sufficient to reconstruct range 210 for object 200. Although only a portion of object 200 may be able to be reconstructed, in certain use cases (e.g., weblog analytics, video processing, signal processing), having some data may be far better than having no data. In one embodiment, erasure code retrieve logic 460 may retrieve erasure codes for range 210 and reconstruct range 210 when a utility measure for having just range 210 exceeds a threshold. In one embodiment, erasure code retrieve logic 460 may retrieve erasure codes for range 210 and reconstruct range 210 in response to a user instruction, a signal from a process, a signal from a circuit, or in response to other automated items.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
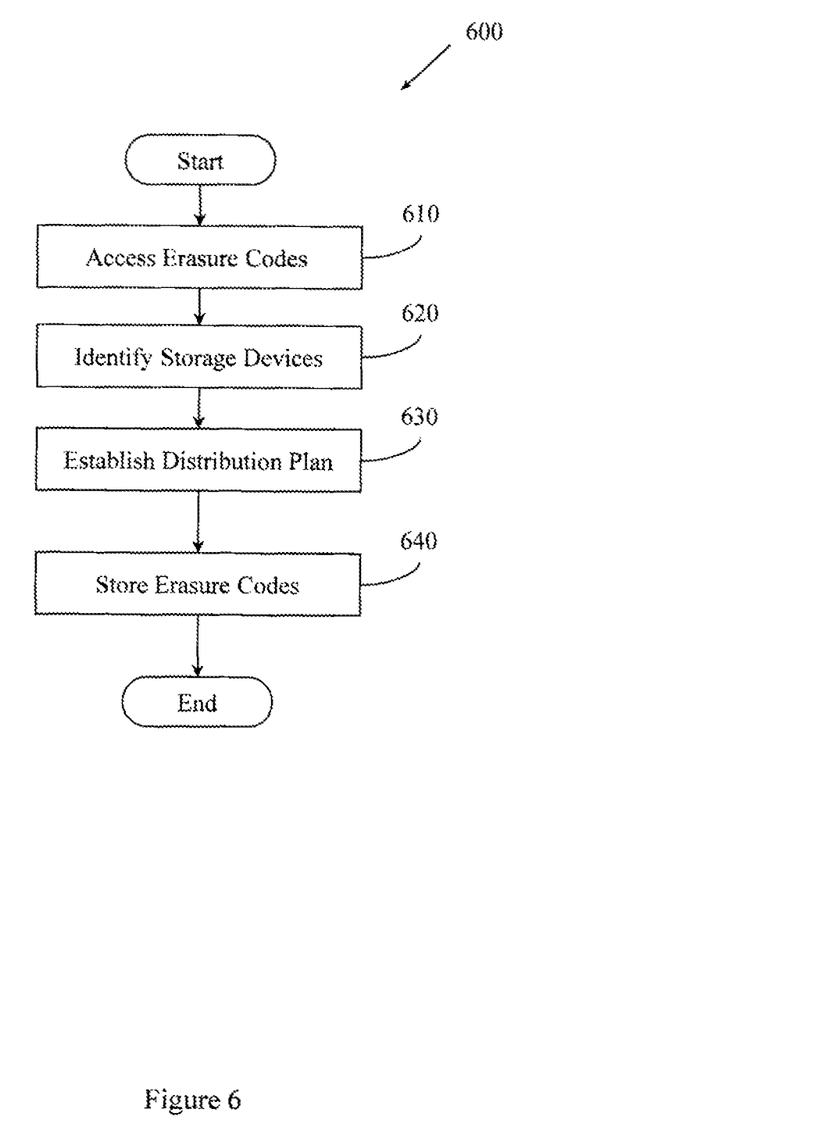
FIG. 6 illustrates an example method associated with mitigating the impact of a single point of failure in an object store.

FIG. 6 illustrates a method 600 associated with mitigating the impact of a single point of failure in an object store. Method 600 includes, at 610, accessing erasure codes associated with related ranges to be stored in an object store. In one embodiment, the related ranges may be associated with a single object. In another embodiment, the related ranges may be associated with a single file. "Related ranges" refers to ranges that are produced for an item and, if all the ranges are available, the item can be completely assembled.

Method 600 also includes, at 620, identifying storage devices associated with the object store. The storage devices may include, for example, disk drives, solid state drives, memories, tape drives, or other storage apparatus. In one embodiment, identifying the storage devices at 620 may include identifying the number of storage devices that are available to the object store. In another embodiment, identifying the storage devices at 620 may include identifying the types of storage devices that are available to the object store. Identifying the number or type of storage devices may include, for example, querying the devices, receiving information pushed from the devices, accessing a device map associated with the object store, or other actions.

Method 600 also includes, at 630, establishing a distribution plan to store the erasure codes on the different storage devices available to the object store. The distribution plan will control the positioning of erasure codes on various devices so that an unavailability of one of the available storage devices will cause less than all of the related ranges to become unavailable. For example, erasure codes for a range may be placed on different subsets of apparatus so that if one apparatus fails, sufficient erasure codes to recreate that range may still be available. In one embodiment, the distribution plan positions erasure codes so that one of the available storage devices being unavailable will cause only one of the related ranges to become unavailable. In one embodiment, the distribution plan positions erasure codes so that one of the available storage devices not being available will cause less than all of the related ranges to become unavailable. Establishing the distribution plan at 630 may include, for example, producing various candidate distributions and then simulating the effect of a storage device becoming unavailable. In one embodiment, establishing the distribution plan may include considering the types of devices available and then arranging for distribution of the erasure codes so that one of the related ranges is stored on a first type of storage device and so that another of the related ranges is stored on a second different type of storage device. Establishing the distribution plan at 630 may include, for example, acquiring information about the available devices and producing a graph of the devices, where the graph includes edges and nodes. The graph may then be analyzed to determine the impact of the removal of an edge (e.g., communication path to a node) or a node (e.g., disk, rack, server, site).

In one embodiment, establishing the distribution plan at 630 may include establishing a redundancy policy for the erasure codes. Since the number or type of storage devices available to the object store are being examined, different (e.g., less redundant) safety factors may be attempted than in conventional systems. For example, an N/1 redundancy policy or even an N/0 redundancy policy may be attempted, N being an integer greater than one.

Method 600 also includes, at 640, causing the erasure codes, and thus the ranges, to be stored by the object store according to the distribution plan. Causing the erasure codes to be stored may include, for example, writing the erasure codes to the object store, providing the erasure codes to a network interface through which the object store acquires erasure codes, providing the erasure codes to a shared memory, making a function call, providing a pointer to an erasure code to an object store, providing a reference to an erasure code to an object store, providing an erasure code address to an object store, or taking other actions.

Figure 7:
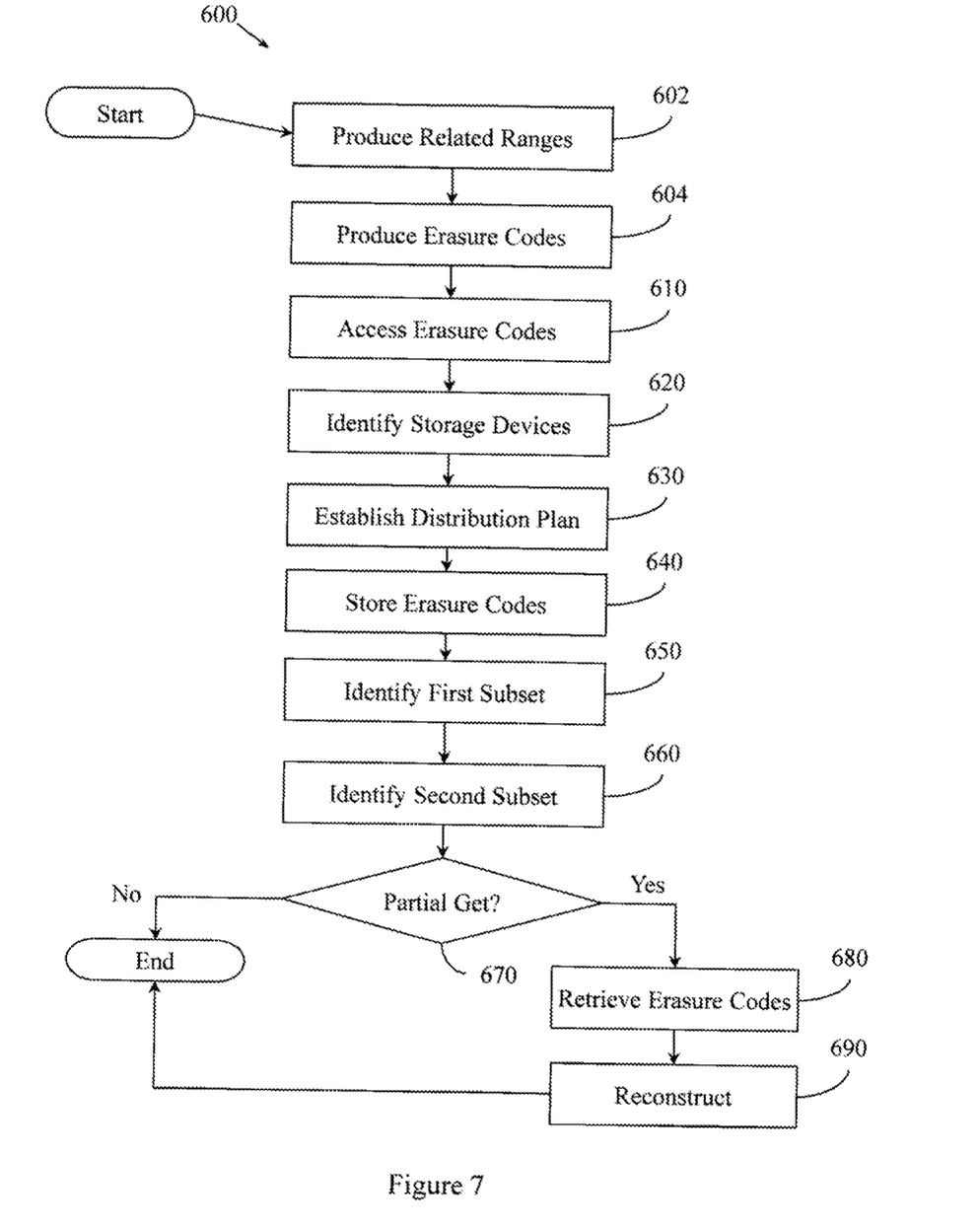
FIG. 7 illustrates an example method associated with mitigating the impact of a single point of failure in an object store.

FIG. 7 illustrates another embodiment of method 600. This embodiment of method 600 also includes, at 602, producing the two or more related ranges. The number of related ranges that are produced may depend on the number of storage devices available to the object store. The number of related ranges that are produced may also depend, for example, on the size or type of object. For example, a large weblog data file may be partitioned into a large number of related ranges while a small video data file may be partitioned into a small number of related ranges.

This embodiment of method 600 also includes, at 604, producing the erasure codes for the related ranges. Once again, the number of erasure codes that are produced may depend on how many storage devices are available to the object store. Producing the erasure codes at 604 may include, for example, partitioning a range into a number of segments and encoding the segments. The erasure codes may be, for example, rateless erasure codes (e.g., fountain codes).

This embodiment of method 600 also includes, at 650, identifying a first subset of related ranges that are retrievable from the object store. Since method 600 may provide a partial GET operation, the first subset may be less than all of the related ranges. If the first subset covers all the ranges for an object, than a traditional GET operation may be performed.

This embodiment of method 600 may also include, at 660, identifying a second subset of the related ranges that are not able to be retrieved from the object store. Information about which ranges are or are not available may be provided.

With the information about which related ranges are or are not available, a decision may be made at 670 concerning whether to perform a partial GET operation. If the decision at 670 is to not perform the partial GET operation, then method 600 may end. But if the decision at 670 is to perform the partial GET operation, then method 600 may proceed, at 680, by retrieving from the object store selected erasure codes associated with the first subset.

With the available erasure codes collected, method 600 may then proceed, at 690, by selectively reconstructing the first subset from the selected erasure codes.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
CPU: central processing unit.
DVD: digital versatile disk and/or digital video disk.
HTTP: hypertext transfer protocol.
I/O: input/output.
IOPS: input output operations per second.
LAN: local area network.
RAM: random access memory.
DRAM: dynamic RAM.
SRAM: synchronous RAM.
RAID: redundant array of independent disks.
ROM: read only memory.
PROM: programmable ROM.
SSD: solid state drive
SAN: storage area network.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
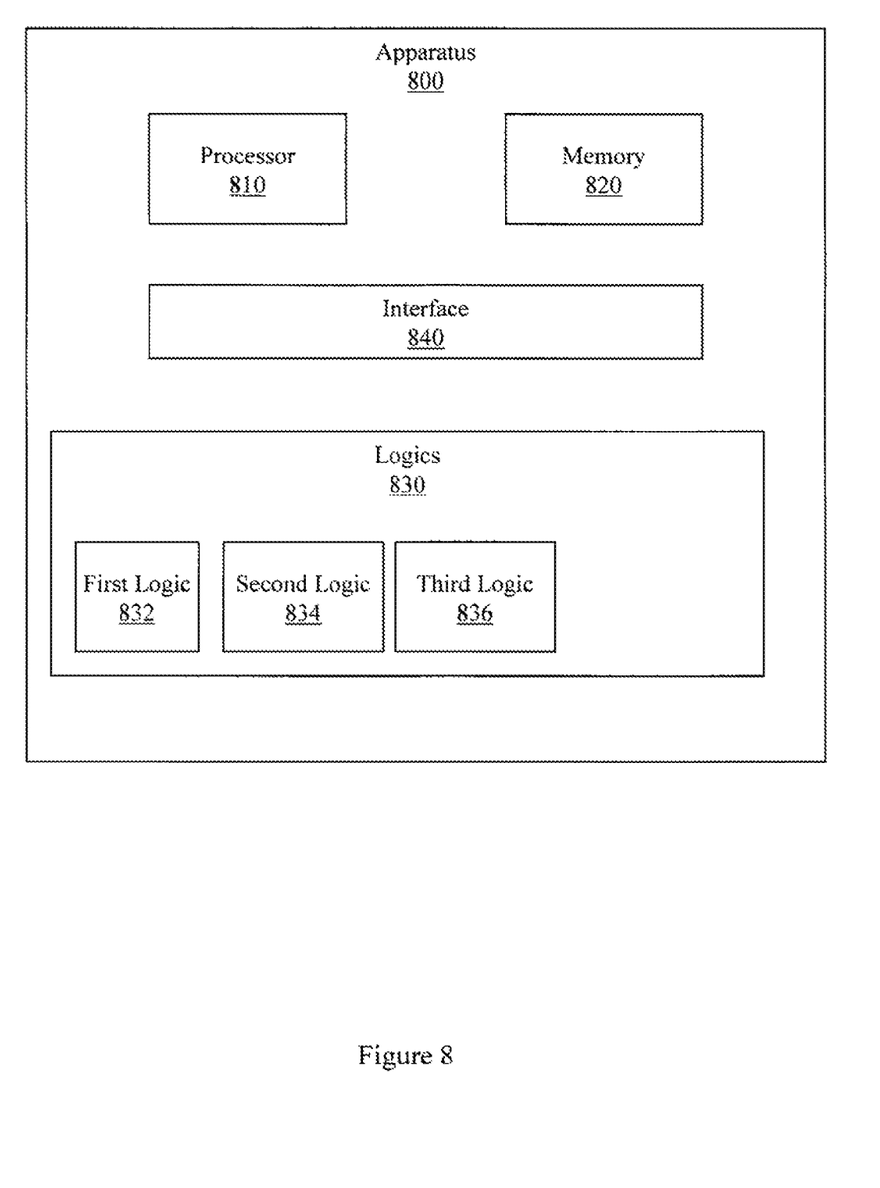
FIG. 8 illustrates an example apparatus that mitigates the impact of a single point of failure in an object store.

FIG. 8 illustrates an apparatus 800 that includes a processor 810, a memory 820, and a set 830 of logics that is connected to the processor 810 and memory 820 by an interface 840. In one embodiment, the apparatus 800 may be an object storage system. In one embodiment, the apparatus 800 may be operably connected to or in data communication with an object storage system. Recall that an object storage system performs object-based storage using a storage architecture that manages data as objects instead of, for example, as files. "Object", as used herein, refers to the usage of object in computer science. From one point of view, an object may be considered to be a location in a physical memory having a value and referenced by an identifier.

In one embodiment, the set of logics 830 may control the location of a range or an erasure code in an erasure code based object store that includes a plurality of storage apparatus. The number or type of storage apparatus available to the object store may affect the number of super blocks that are produced for an object to be stored by the object store. The plurality of storage apparatus may include, for example, disks, solid state drives, tapes, memories, or other computer-readable storage media. The set of logics 830 may mitigate the impact of a single point of failure in an object store. For example, the set of logics 830 may control super block distribution to reduce the impact of a single point of failure in an object store that includes a plurality of storage apparatus.

The set 830 of logics may include a first logic 832 that identifies distinct subsets of storage apparatus from the plurality of storage apparatus. The distinct subsets of storage apparatus will be used to control where members of a plurality of super blocks associated with an object are stored in the object store. In one embodiment, the distinct subsets limit how many super blocks from the plurality of super blocks can be stored in a single member of the plurality of storage apparatus. In one embodiment, the distinct subsets make sure that just one super block from the plurality of super blocks can be stored in a single member of the plurality of storage apparatus. In one embodiment, the distinct subsets may be identified by, for example, simulating the effect of a single point of failure for various candidate subsets and then selecting the candidate subsets that yield the optimal results.

The apparatus 800 may also include a second logic 834 that establishes a redundancy policy for erasure codes associated with the object. Recall that a redundancy plan can be described as an N/M policy, where N describes the total number of erasure codes associated with a super block, and N−M describes the minimum number of the N erasure codes needed to reconstruct the super block. N is greater than M, and N and M are integers. Since attention is paid to the potential effects of a single point of failure, and since a partial GET operation is provided, different safety cases may be employed than in conventional systems. For example, in one embodiment, M may be one, and in another embodiment, M may even be zero.

The apparatus 800 may also include a third logic 836 that controls an object store to store the erasure codes. The third logic 836 will store the erasure codes as controlled by the redundancy policy and by the distinct subsets of storage apparatus. Storing the erasure codes may include writing erasure codes to a memory, making a function call, making a procedure call, writing an address of an erasure code to a memory, writing an address of an erasure code to a register, or other action.

Figure 9:
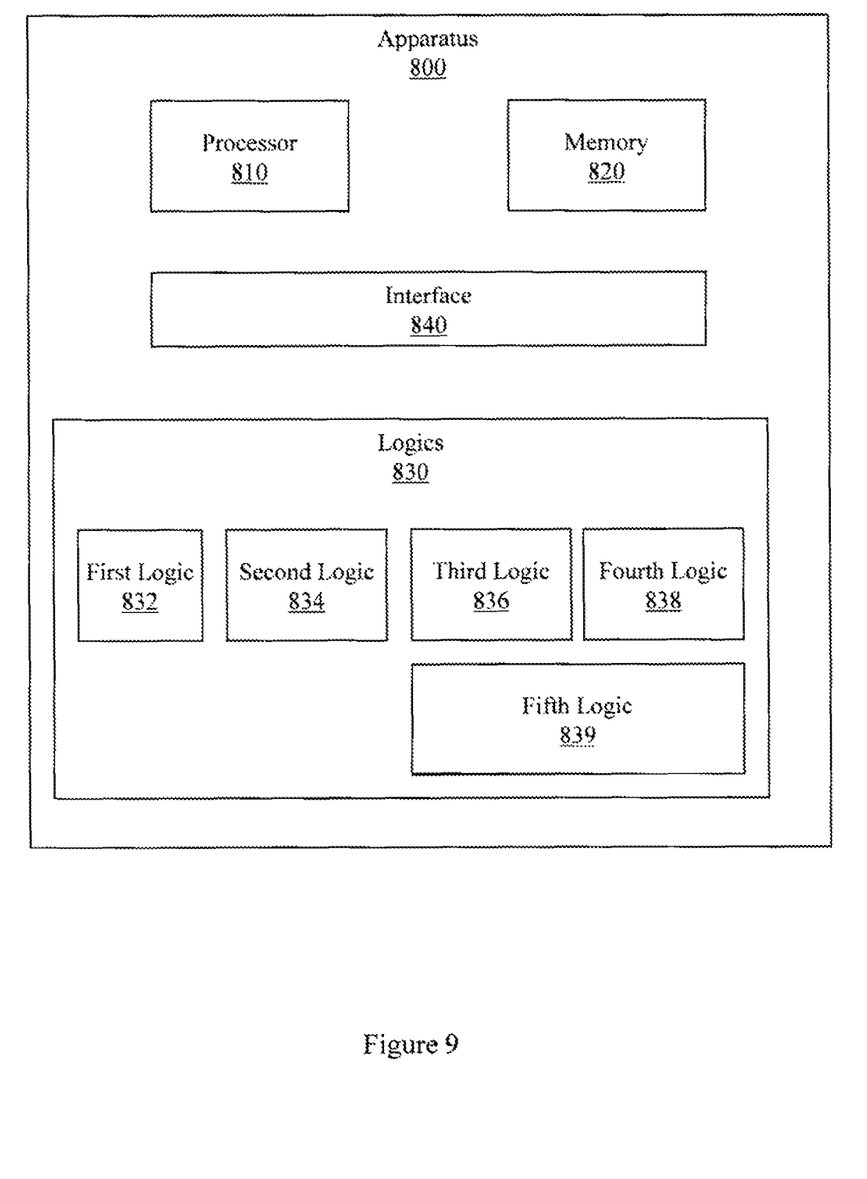
FIG. 9 illustrates an example apparatus that mitigates the impact of a single point of failure in an object store.

FIG. 9 illustrates another embodiment of apparatus 800. This embodiment includes a fourth logic 838. The fourth logic 838 may identify how many super blocks for an object can be reconstructed from the object store. In different embodiments, the fourth logic 838 may provide data describing how many super blocks can be identified, may provide data describing which super blocks can be identified, or may provide other information from which the utility of the returnable super blocks can be determined. In one embodiment, the fourth logic 838 may selectively retrieve less than all the super blocks for an object from the object store. Less than all the super blocks for an object may be retrieved upon determining, for example, that a desired reconstruction utility can be achieved from less than all the super blocks.

This embodiment of apparatus 800 also includes a fifth logic 839. Fifth logic 839 may partition the object into the plurality of super blocks. In one embodiment, the number of super blocks into which the object is partitioned may be selected based, at least in part, on how many storage apparatus are available in the plurality of storage apparatus. In one embodiment, if just two storage apparatus are available, then an object may be partitioned into two or more super blocks. In another embodiment, if three storage apparatus are available, then an object may be partitioned into three or more super blocks. Different numbers of super blocks, both greater and less than the number of available storage apparatus, may be produced.

Figure 10:
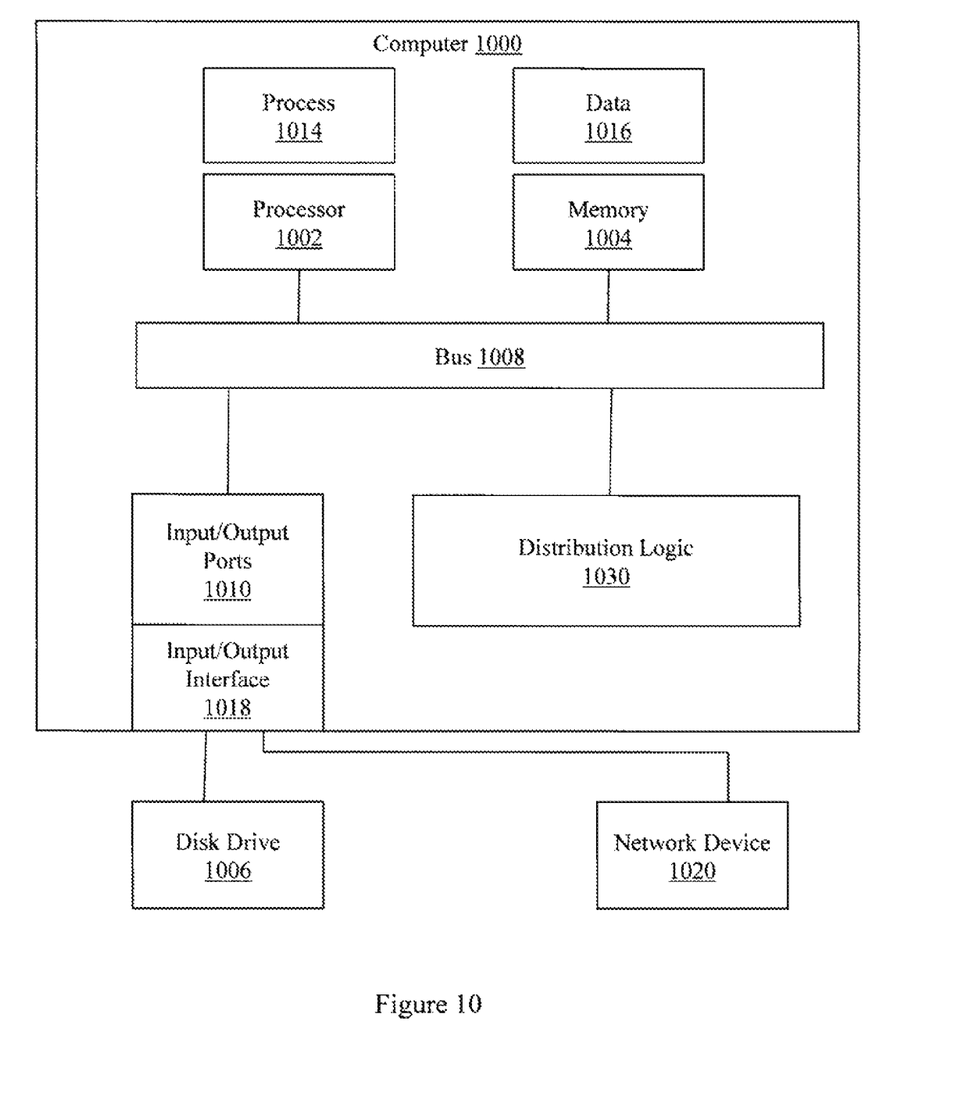
FIG. 10 illustrates an example apparatus that mitigates the impact of a single point of failure in an object store.

FIG. 10 illustrates an example computing device in which example systems and methods described herein, and equivalents, may operate. The example computing device may be a computer 1000 that includes a processor 1002, a memory 1004, and input/output ports 1010 operably connected by a bus 1008. In one example, the computer 1000 may include a distribution logic 1030 that controls the distribution of ranges or erasure codes between devices available to an object store. In different examples, the logic 1030 may be implemented in hardware, software, firmware, and/or combinations thereof. While the logic 1030 is illustrated as a hardware component attached to the bus 1008, it is to be appreciated that in one example, the logic 1030 could be implemented in the processor 1002.

In one embodiment, logic 1030 may provide means (e.g., hardware, software, firmware, circuit) for identifying how many storage apparatus are available to an object store that stores rateless erasure codes. The number of storage apparatus may be stored, for example, as an integer. The number of storage apparatus may determine, at least in part, the number of segments into which an object may be subdivided to help mitigate the impact of a single point of failure. The number of storage apparatus may also determine, at least in part, how many erasure codes may be generated for a segment.

Logic 1030 may also provide means (e.g., hardware, software, firmware, circuit) for segmenting an object. The object may be segmented into a number of segments that depends on how many storage apparatus are available to the object store. In one embodiment, an object may be subdivided into a multiple of the number of storage apparatus.

Logic 1030 may also provide means (e.g., hardware, software, firmware, circuit) for storing erasure codes associated with the segments. In one embodiment, the erasure codes for the segments may be stored so that the unavailability of one storage apparatus will only cause the unavailability of a single segment. In another embodiment, the erasure codes for the segments may be stored so that the unavailability of one storage apparatus will cause the unavailability of less than all the segments.

Logic 1030 may also provide means (e.g., hardware, software, firmware, circuit) for reconstructing a portion of the object from less than all the segments stored in the object store. A conventional GET operation may return an error code if less than all of the segments for an object can be returned. Logic 1030 is not so limited. Instead, logic 1030 may return the segments that are available so that a user or process can determine what, if anything, can be done with the partial object.

The means associated with logic 1030 may be implemented, for example, as an ASIC that implements the functionality of apparatus described herein. The means may also be implemented as computer executable instructions that implement the functionality of methods described herein and that are presented to computer 1000 as data 1016 that are temporarily stored in memory 1004 and then executed by processor 1002.

Generally describing an example configuration of the computer 1000, the processor 1002 may be a variety of various processors including dual microprocessor and other multi-processor architectures. A memory 1004 may include volatile memory and/or non-volatile memory. Non-volatile memory may include, for example, ROM, PROM, and other memory. Volatile memory may include, for example, RAM, SRAM, DRAM, and other memory.

A disk 1006 may be operably connected to the computer 1000 via, for example, an input/output interface (e.g., card, device) 1018 and an input/output port 1010. The disk 1006 may be, for example, a magnetic disk drive, a solid state disk drive, a floppy disk drive, a tape drive, a Zip drive, a flash memory card, a memory stick, or other device. Furthermore, the disk 1006 may be a CD-ROM drive, a CD-R drive, a CD-RW drive, a DVD ROM drive, a Blu-Ray drive, an HD-DVD drive, or other device. The memory 1004 can store a process 1014 and/or a data 1016, for example. The disk 1006 and/or the memory 1004 can store an operating system that controls and allocates resources of the computer 1000.

The bus 1008 may be a single internal bus interconnect architecture and/or other bus or mesh architectures. While a single bus is illustrated, it is to be appreciated that the computer 1000 may communicate with various devices, logics, and peripherals using other busses (e.g., PCIE, 1394, USB, Ethernet). The bus 1008 can be types including, for example, a memory bus, a memory controller, a peripheral bus, an external bus, a crossbar switch, and/or a local bus.

The computer 1000 may interact with input/output devices via the i/o interfaces 1018 and the input/output ports 1010. Input/output devices may be, for example, a keyboard, a microphone, a pointing and selection device, cameras, video cards, displays, the disk 1006, the network devices 1020, and other devices. The input/output ports 1010 may include, for example, serial ports, parallel ports, and USB ports.

The computer 1000 can operate in a network environment and thus may be connected to the network devices 1020 via the i/o interfaces 1018, and/or the i/o ports 1010. Through the network devices 1020, the computer 1000 may interact with a network. Through the network, the computer 1000 may be logically connected to remote computers. Networks with which the computer 1000 may interact include, but are not limited to, a LAN, a WAN, and other networks.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage device storing computer-executable instructions that when executed by a computer cause the computer to perform a method, the method comprising:
    accessing erasure codes associated with members of two or more related ranges to be stored in an object store, where the two or more related ranges are associated with a single object;
    identifying two or more different storage devices associated with the object store;
    identifying two or more different types of storage devices associated with the object store;
    establishing a distribution plan to store the erasure codes on the two or more different storage devices so that one of the two or more different storage devices becoming unavailable will cause only one of the related ranges to become unavailable, and so that a first member of the two or more related ranges is stored on a first type of storage device and a second, different member of the two or more related ranges is stored on a second different type of storage device;
    causing the erasure codes to be stored by the object store according to the distribution plan;
    identifying a first subset of the two or more related ranges that are retrievable from the object store, where the first subset may be less than all of the related ranges;
    upon determining that the first subset meets a threshold utility measure;
        reducing a redundancy setting associated with the object store;
        retrieving selected erasure codes associated with the first subset from the object store; and
        selectively reconstructing the first subset from the selected erasure codes.

2. The non-transitory computer-readable storage device of claim 1, where the two or more different storage devices include disk drives, solid state drives, or tape drives.

3. The non-transitory computer-readable storage device of claim 1, where the two or more different types of storage devices include a hard disk drive, a solid state drive, or a tape drive.

4. The non-transitory computer-readable storage device of claim 1, where establishing the distribution plan includes establishing a redundancy policy for the erasure codes.

5. The non-transitory computer-readable storage device of claim 4, where the redundancy policy is an N/1 policy, N being an integer greater than one.

6. The non-transitory computer-readable storage device of claim 4, where the redundancy policy is an N/0 policy, N being an integer greater than one.

7. The non-transitory computer-readable storage device of claim 1, the method comprising:
    identifying a second subset of the related ranges that are not able to be retrieved from the object store, and
    providing data concerning the second subset.

8. The non-transitory computer-readable storage device of claim 1, the method comprising:
    identifying a number D that describes how many storage devices are in the two or more storage devices, D being an integer;
    producing the two or more related ranges, where the number of related ranges is greater than or equal to D, and producing the erasure codes for the related ranges, where the number of erasure codes is greater than or equal to D.

9. An apparatus, comprising:

a processor;

a memory comprising a non-transitory computer-readable storage medium;

a set of logics that control super block distribution to reduce the impact of a single point of failure in an object store that includes a plurality of storage apparatus; and an interface that connects the processor, the memory, and the set of logics;

the set of logics comprising:

- a first logic that identifies a plurality of distinct subsets of storage apparatus from the plurality of storage apparatus, where members of the plurality of distinct subsets of storage apparatus will be used to store members of a plurality of super blocks associated with an object to be stored in the object store, where a single member of the plurality of super blocks can be stored in a single member of the plurality of storage apparatus, where a single member of the plurality of storage apparatus becoming unavailable will cause only one of the plurality of super blocks to become unavailable;

- a second logic that establishes a redundancy policy for erasure codes associated with the object, the redundancy policy being an N/M policy, where N describes the total number of erasure codes associated with a super block, N−M describes the minimum number of the N erasure codes needed to reconstruct the super block, N being greater than M, N and M being integers;

- a third logic that controls an object store to store the erasure codes in members of the plurality of storage apparatus as controlled by the redundancy policy; and

- a fourth logic that identifies how many of the plurality of super blocks can be reconstructed from the object store and provides data describing how many of the plurality of super blocks can be reconstructed, where the fourth logic selectively retrieves one or more of the super blocks from the object store upon determining that a desired reconstruction utility can be achieved from the one or more super blocks, where the one or more super blocks are less than all the super blocks, where the fourth logic controls the second logic to reduce a redundancy level associated with the redundancy policy.

10. The apparatus of claim 9, where M is one or where M is zero.

11. The apparatus of claim 9, where identifying the distinct subsets of storage apparatus includes the first logic considering a user-defined rule, an automated rule, or an input from a user interface.

12. The apparatus of claim 9, comprising a fifth logic that partitions the object into the plurality of super blocks, where the number of super blocks into which the object is partitioned is determined based, at least in part, on how many storage apparatus are available in the plurality of storage apparatus.

* * * * *